July 28, 1959 J. J. GITTO 2,897,409

PLATING PROCESS

Filed Oct. 6, 1954

*INVENTOR.*

JOSEPH J. GITTO

*BY*

Connolly and Hutz

HIS ATTORNEYS

United States Patent Office 2,897,409

Patented July 28, 1959

2,897,409

PLATING PROCESS

Joseph J. Gitto, Brooklyn, N.Y., assignor to Sprague Electric Company, North Adams, Mass., a corporation of Massachusetts Application October 6, 1954, Serial No. 460,613

2 Claims. (Cl. 317—101)

Figure 1:
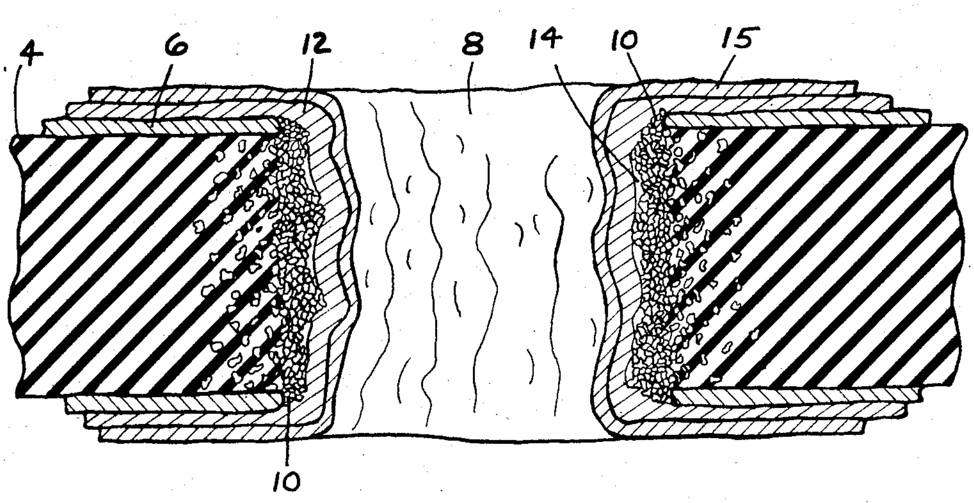

This invention relates to the provision of improved terminal boards (and methods for their preparation) suitable for printed circuit application and more particularly to such terminal boards having conductors contiguous with the opposed surfaces of the board, each surface of which has imposed conductive indicia.

Terminal boards, as presently used in printed circuitry, are generally prepared using insulating plastic base boards. These boards are clad with a conductive layer using a metallic element, such as copper. Holes are then punched at the desired positions on the board and graphite is deposited to cover the exposed areas of the holes. The resulting conductive surface is then electroplated and, after masking, the desired circuit is obtained by an etching process. Components are then positioned as desired, on the board and soldering, usually with lead-tin or tin solder, yields the finished product. Other prior art methods are obviously available for the preparation of such products, the present invention involving primarily an improvement in the construction and preparation methods.

The use of graphite for producing a conductive base surface on the exposed areas of the holes punched in the base boards results in an extremely deficient product. For example, it is generally accepted that graphite is disadvantageous since it migrates a substantial distance into the insulating member during electro-deposition, particularly in the region about the electroplated hole. This migration not only deleteriously effects the insulation properties of the dielectric member but also results in voids within or between the graphite coating and the metallic coating, electroplated thereon. The electroplated coating has thus been found to be fragile and susceptible to fracture resulting in either a high resistance path between the two opposed conductive surfaces and/or an open circuit. Another defect resulting from the use of graphite is that it is not bound well to the surface of the dielectric member upon which it is imposed; the graphite is deposited in large clumps so that the electroplated coating is extremely uneven.

It is an object of this invention to overcome the foregoing and related disadvantages. It is a further object of this invention to produce a terminal board having mechanically strong conducting paths contiguous with the opposed conducting surfaces.

It is a still further object of this invention to prepare an electroplated conducting path between opposed conducting surfaces of a terminal board by the use of a novel electroplating electrode layer. These and further objects of this invention will become more apparent from the following description and appended claims.

These objects have been achieved in accordance with this invention by the production of terminal boards comprising a resinous dielectric base having conductive coatings defining an electrical circuit on at least two surfaces of said base, said conductive coatings on each surface being electrically connected by another conductive coating over the exposed area of holes in said base, the initial layer of the latter conductive coating being that of non-diffusible metal particles (i.e. those which do not migrate into the resinous dielectric base). The conductive coatings on each surface usually include a metal (preferably copper) clad on the dielectric base, an electrodeposited layer, preferably of copper, on said clad base and a metallic top-coat. The coating in the exposed area of the holes made in the dielectric base usually includes, over the initial layer of non-diffusible metal particles, a layer of electrodeposited metal (preferably copper) and a metallic top-coat.

These novel terminal boards may be produced in accordance with the process of this invention by (1) fabricating holes through the opposed surfaces of a metal clad resinous base (2) depositing a conductive coating of a metal of particle size smaller than 250 mesh on the exposed area of the holes (copper is preferred for this purpose but other metals, such as nickel, iron, zinc and aluminum may be used) and (3) forming the printed circuit configuration in accordance with standard procedure. Such printed circuit configuration may be effected by electrodepositing a copper (or other conductive metal) coating over the conductive areas, masking the etching to obtain the desired pattern and, finally applying a metallic top-coat (preferably a tin or lead-tin dip solder). It is obvious to one skilled in the art that the sequence in which certain steps of the process are carried out my be altered; and the concept of this invention includes such variations.

As seems clear from the discussion above, a primary feature of this invention concerns the substitution for the prior art graphite, of a non-diffusible metallic particle layer (preferably of copper) about the exposed area of holes in the dielectric base plates used in printed circuitry. This metallic particle layer must be formed using materials smaller than 250 mesh, as is brought out in the data tabulated below:

*Plating on Plastics*

| Sample # | Conductive Material | Method Applied | Mixture | Ratio | | | Appearance | Flash Copper Plate | Electro-Plate Results | Copper Acid Plate |
|---|---|---|---|---|---|---|---|---|---|---|
| | | | | Lacquer | Thinner | Copper | | | | |
| 1 | Copper particles, 250 mesh. | sprinkled | lacquer+particles | 1 | | 1 | poor | | poor | x |
| 2 | do | do | lacquer+thinner+particles. | 1 | 2 | 1 | do | | do | x |
| 3 | copper dust | dipped | lacquer+thinner+dust. | 2 | 5 | 1 | very good | x | very good | x |
| 4 | do | do | do | 4 | 5 | 1 | good | x | do | x |
| 5 | colloidal copper | do | lacquer+thinner+colloidal copper. | | | | excellent | x | do | x |

Figure 2:
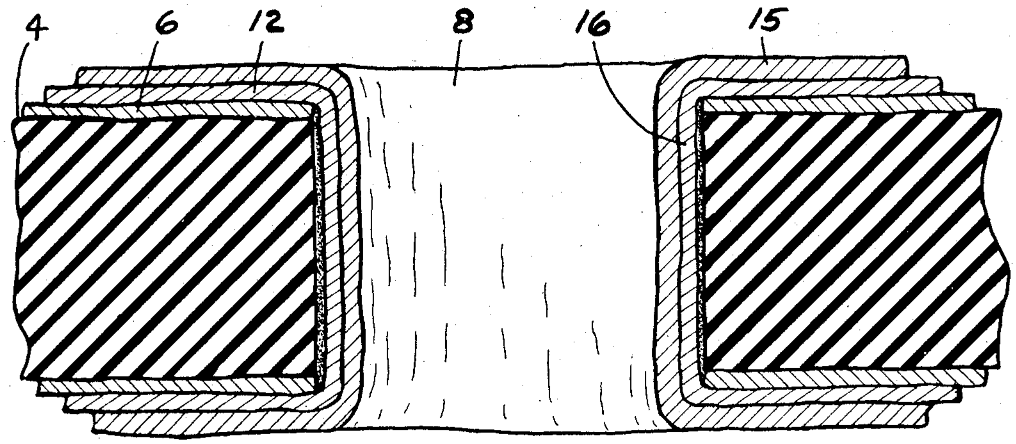

For a complete understanding of this invention reference should now be made to the attached drawing in which:

Fig. 1 shows in cross-section the electroplated conductor as prepared by prior art means; and Fig. 2 shows a similar cross-sectional view of a conductor produced in accordance with this invention.

With reference now to Fig. 1, the terminal board, of which this is a small segment in cross-sectional view, generally consists of the insulating member 4 coated on opposed surfaces with a conductive coating 6. As indicated above, the terminal board now in general usage is a resinous laminate clad with copper on opposed surfaces. This copper clad laminate has a number of holes punched completely through the member to provide for the subsequent conductive means between the conductive coatings on the opposed surfaces. Such a punched hole is indicated by 8 and has deposited upon its exposed area a coating of graphite 10 which is applied either by spraying or dipping, the graphite being contained in a suitable vehicle for application. The surplus graphite is wiped off the copper conducting surfaces 6. Thereafter a continuous layer of copper or other conducting metal 12 is electrodeposited on the surface and, in the holes of the punched terminal board, onto the graphite conductive coating 10. Thereafter, the circuit design being used is masked on the conducting strata 12 on the surface of the board and the exposed area is subjected to etch treatment so as to eventually yield the circuit indicia. Finally an alloy such as lead-tin is applied by simply dipping into the molten solder to yield a conductive layer 15. As is seen in this cross-sectional view of Fig. 1, the graphite particles 10 have migrated inwardly into the primary body of the insulating member 4, thus degenerating the electrical insulation characteristics of the dielectric. Furthermore, it should be noted that in several places as that one marked 14 the migration and/or clumping of the graphite particles has produced voids beneath or excessive undulations of the electrodeposited coating 12. These latter phenomena produce mechanically fragile, as well as discontinuous, coatings.

It has now been discovered that the deficiencies of the currently used graphite undercoat for electrodeposition can be overcome by coating with metal particles having a particle size of less than about 250 mesh. This is quite unexpected for the graphite not only is an excellent conductor but is also of extremely small physical size. By the utilization of the small metal particles, preferably those of copper, one does not find diffusion of the particles into the plastic laminate, so common with the graphite, nor does one find discontinuous electrodeposited coatings. Typical metals which may be used, include copper, iron, zinc, nickel, and aluminum. Of these, copper is preferred, particularly in colloidal size.

Perhaps the invention will become more apparent now by reference to Fig. 2 which shows, a segment in cross-section of an electrodeposited conductive member produced in accordance with this invention. In this drawing like numbers refer to like materials of Fig. 1. The dielectric terminal member 4 is clad with a conductive coating 6 (preferably of copper) on its opposed surfaces. Instead of the graphite coating of the prior art, the hole, which has been punched in the terminal board, has a deposit of copper 16 of particle size less than about 250 mesh on the surface defined by the hole. This copper deposition may be effected in numerous ways but to obtain optimum results, dispersion of the particles in a volatile solvent and application by spraying, dipping or painting is preferred. The copper particles can be distributed throughout any of the well-known lacquers, e.g. nitro cellulose, cellulose acetate, cellulose acetate butyrate and thinned as desired with volatile solvents such as amyl acetate, benzene, toluene, etc. After application of the conductive layer 16 the electrodeposited layer 12 is applied and the board, finally etched and dipped into the solder bath to form layer 15 and produce the structure of Fig. 2.

A critical aspect of this invention resides in the particle size of the conducting layer of metal disposed on the wall surfaces of each of the holes onto which the conductor is subsequently electrodeposited. For metallic particles about 200 mesh or larger, it was found that apparently regardless of the vehicle used to position the copper particles onto the wall surface, the subsequently electrodeposited conductive coatings were as fragile, discontinuous, and susceptible to fracture as those deposited upon a graphite conductive coating. With either electrolytic copper dust (less than 325 mesh) or colloidal sized copper particles disposed in a paint vehicle, one can achieve mechanically sturdy electroplated coatings which are not susceptible to fracture and not migratory. The metallic particles to be satisfactory must be of a diameter less than 250 mesh, preferably less than 350 mesh. The range of particle size of copper which is preferred for the coated electrode upon which electrodeposition takes place is from about .1 micron to about 20 microns.

The base member of the terminal board as indicated in the foregoing discussion is an insulator usually a thermoset resin laminated or filled with other insulator bodies. Typical of such is phenol formaldehyde resin laminated with kraft or linen paper, epoxy resin impregnated fiber glass, silicone resin impregnated glass fibers, and melamine formaldehyde resin impregnated glass fibers. These insulator base members are clad with a copper coating, the entire structure being of such typical thicknesses as 1/16" and 1/8". The copper conductive layer is cemented to the insulator in the usual manner with a suitable thermoset resin cement as those prepared from phenolic resins, urea resins or epoxy resins dispersed in a volatile solvent or binder.

As a specific example of my invention a copper clad phenol formaldehyde base member of 1/8" thickness was fabricated with 12 punched holes of 1/8" diameter. The copper layer imposed on both surfaces of the base material was of about 0.0012" thickness. The structure was degreased by exposure to carbon tetrachloride vapors of about 140° F. to 150° F. for ten minutes. After a short exposure to air the structure was dipped into a copper paint consisting of about 80% by weight of colloidal copper suspended in an organic vehicle such as butylacetate. The excess was removed directing air into the holes and thereafter wiping off by cloth. The coated holes were air dried. The general procedure for electroplating was used with the cyanide copper flash followed by exposure to a typical plating solution as copper sulfate.

More specifically, the copper member was made the cathode in an electroplating cell and immersed in a flash plating aqueous solution at room temperature of composition:

| | Oz./gal. |
|---|---|
| Copper cyanide | 3 |
| Sodium cyanide | 4.5 |
| Caustic soda | 1/2 |

For 1½ minutes the member was subjected to a current density of 67 ma. per square inch. After washing with water the member is subjected to plating in a cell containing an aqueous bath of composition:

| | Oz./gal. |
|---|---|
| Copper sulfate | 30 |
| Sulfuric acid | 9 |

for 30 minutes at a current density of 67 ma. per square inch. The member was thereafter withdrawn and washed with water and dried.

As many apparently widely different embodiments of this invention may be made without departing from the spirit and scope hereof, it is to be understood that the invention is not limited to the specific embodiments hereof except as defined in the appended claims.

What is claimed is:

1. A terminal board for a printed circuit assembly comprising in combination a plural layer conductive coating for connecting two conductors, an underlayer of said plural layer conductive coating composed of metal particles selected from the group consisting of copper, nickel, iron, zinc and aluminum in a suitable vehicle and having a particle size of less than about 250 mesh, an electrodeposited conductive layer overlying said underlayer forming the outer layer of said plural layer coating, a resinous dielectric base carrying said plural layer coating, conductors on exposed surfaces of said resinous dielectric base connected by said plural layer coating and an aperture through said base containing said plural layer coating, and an exposed surface on said aperture covered by said underlayer whereby the conductors on each surface of said base are connected by said plural layer coating and a conductive layer of non-migratory particles is in contact with said exposed area of said base.

2. A method of producing printed circuitry in which opposed conductive coatings on a resinous dielectric base are connected through conductive metal coated apertures, the steps of fabricating apertures through the opposed surfaces of a metal clad resinous base, forming in said apertures an underlayer of non-diffusible metal particles selected from the group consisting of copper, nickel, iron, zinc and aluminum in a particle size of less than about 250 mesh contained in a vehicle and electrodepositing in said aperture over said underlayer a conductive coating of an electrodepositable metal without causing migration of the metal particles of the underlayer into the resinous base.

References Cited in the file of this patent

UNITED STATES PATENTS

| | | |
|---|---|---|
| 2,423,290 | Bonwitt | July 1, 1947 |
| 2,433,384 | McLarn | Dec. 30, 1947 |
| 2,474,988 | Sargrove | July 5, 1949 |
| 2,530,217 | Bain | Nov. 14, 1950 |

OTHER REFERENCES

"Printed Circuit Techniques," National Bureau of Standards Circular 468, page 20.

"New Advances in Printed Circuits," National Bureau of Standards Miscellaneous Publication 192, pages 37 and 52.

UNITED STATES PATENT OFFICE

CERTIFICATE OF CORRECTION

Patent No. 2,897,409 July 28, 1959

Joseph J. Gitto

It is hereby certified that error appears in the printed specification of the above numbered patent requiring correction and that the said Letters Patent should read as corrected below.

Column 2, line 39, for "the", first occurrence, read -- then --.

Signed and sealed this 8th day of March 1960.

(SEAL)

Attest:

KARL H. AXLINE

Attesting Officer

ROBERT C. WATSON

Commissioner of Patents